US009153743B2

(12) United States Patent
Lin et al.

(10) Patent No.: US 9,153,743 B2
(45) Date of Patent: Oct. 6, 2015

(54) METHOD OF FORMING LIGHT EMITTING DIODE DIES, LIGHT EMITTING DIODE WAFER AND LIGHT EMITTING DIODE DIE

(71) Applicant: Genesis Photonics Inc., Tainan (TW)

(72) Inventors: Cheng-Hung Lin, Tainan (TW); Yu-Yun Lo, Tainan (TW); Cheng-Yen Chen, Tainan (TW); Yu-Hung Lai, Tainan (TW)

(73) Assignee: Genesis Photonics Inc., Tainan (TW)

( * ) Notice: Subject to any disclaimer, the term of this patent is extended or adjusted under 35 U.S.C. 154(b) by 34 days.

(21) Appl. No.: 13/835,367

(22) Filed: Mar. 15, 2013

(65) Prior Publication Data
US 2014/0103367 A1 Apr. 17, 2014

(30) Foreign Application Priority Data

Oct. 17, 2012 (TW) .............................. 101138228 A

(51) Int. Cl.
*H01L 33/36* (2010.01)
*H01L 33/00* (2010.01)
*H01L 27/15* (2006.01)
(52) U.S. Cl.
CPC ................ *H01L 33/36* (2013.01); *H01L 27/15* (2013.01); *H01L 33/005* (2013.01); *H01L 33/0095* (2013.01); *H01L 2933/0025* (2013.01)
(58) Field of Classification Search
CPC ....... H01L 33/36; H01L 33/005; H01L 27/15; H01L 33/0095; H01L 33/508; H01L 33/20
See application file for complete search history.

(56) References Cited

U.S. PATENT DOCUMENTS

| 6,515,309 B1 * | 2/2003 | Tohyama et al. ............... 257/88 |
| 7,495,462 B2 * | 2/2009 | Hua et al. .................. 324/750.3 |
| 2007/0177244 A1 * | 8/2007 | Jang et al. ..................... 359/290 |

FOREIGN PATENT DOCUMENTS

| CN | 101257071 A | 9/2008 |
| CN | 102500933 A | 6/2012 |

OTHER PUBLICATIONS

Search Report from Taiwanese Patent Application No. 101138228 mailed on Oct. 20, 2014.

* cited by examiner

*Primary Examiner* — David Vu
*Assistant Examiner* — Mouloucoulaye Inoussa
(74) *Attorney, Agent, or Firm* — Jianq Chyun IP Office

(57) ABSTRACT

A method of forming light emitting diode dies includes: forming an epitaxial layered structure that defines light emitting units on a front surface of a substrate wafer; forming a photoresist layer over a back surface of the substrate wafer; aligning the substrate wafer and patterning the photoresist layer so as to form openings in the photoresist layer, each of the openings having an area less than a projected area of the respective light emitting unit; forming a solder layer on the photoresist layer such that the solder layer fills the openings in the photoresist layer; removing the photoresist layer and a portion of the solder layer that covers the photoresist layer from the substrate wafer; and dicing the substrate wafer.

9 Claims, 8 Drawing Sheets

METHOD OF FORMING LIGHT EMITTING DIODE DIES, LIGHT EMITTING DIODE WAFER AND LIGHT EMITTING DIODE DIE

CROSS-REFERENCE TO RELATED APPLICATION

This application claims priority of Taiwanese Patent Application no. 101138228, filed on Oct. 17, 2012.

BACKGROUND OF THE INVENTION

1. Field of the Invention

This invention relates to a light emitting diode wafer, a light emitting diode die, and a method of forming light emitting diode dies, more particularly to a method of forming light emitting diode dies including forming die-bonding members over a back surface of a substrate wafer using photolithographic techniques.

2. Description of the Related Art

FIG. 1 illustrates how light emitting diode dies 13 (only one is shown for the sake of brevity) are attached to a package substrate 100 using silver paste 101 (as a die-bonding member) for forming light emitting products, such as lamps or backlight modules. Each of the light emitting diode dies 13 includes a die substrate 11, an epitaxial layered structure 12 formed on the die substrate 11, and a pair of electrodes 131 formed on the epitaxial layered structure 12. Conventionally, the light emitting diode dies 13 are attached to the package substrate 100 through the silver paste 101 using a paste dispensing apparatus. However, the process of attaching the silver paste using the paste dispensing apparatus is relatively time consuming and tedious.

FIGS. 2 and 3 illustrate consecutive steps of a conventional method of forming light emitting diode dies 18, which are ready to be attached to a package substrate (not shown). The method includes the steps of forming an epitaxial layered structure 15 on a substrate wafer 16, forming a layer of an eutectic solder material 17 on a back surface of the substrate wafer 16, and dicing and breaking the substrate wafer 16 along predetermined cutting lines so as to form a plurality of the light emitting diode dies 18, each of which has an eutectic solder layer 19 of the eutectic solder material 17. In a packaging process, the eutectic solder layers 19 of the light emitting diode dies 18 are pressed against a heated package substrate (not shown) to cause reflow of the eutectic solder layers 19, followed by cooling the eutectic solder layers 19 so as to permit bonding of the light emitting diode dies 18 to the package substrate. A typical example of the eutectic solder material 17 is Gold-Tin (Au—Sn) alloy.

Applicant found that an undesired overflow of a melt of the eutectic solder layer 19 around side walls of each of the light emitting diode dies 18 tends to occur during the reflowing of the eutectic solder layer 19 on the package substrate, which can result in short circuit or current leakage and failure of the light emitting diode dies 18. In addition, since the eutectic solder material 17 is opaque and since alignment marks are formed on a front surface of the substrate wafer 16, alignment of the substrate wafer 16 in a dicing apparatus cannot be conducted using the alignment marks and suitable alignment means other than the alignment marks are required for accurately dicing and breaking the substrate wafer 16 along the predetermined cutting lines.

SUMMARY OF THE INVENTION

Therefore, an object of the present invention is to provide a method of forming light emitting diode dies that can overcome the aforesaid drawbacks associated with the prior art.

Another object of the present invention is to provide a light emitting diode wafer and a light emitting diode die.

According to one aspect of this invention, there is provided a method of forming light emitting diode dies. The method comprises: forming a plurality of alignment marks and an epitaxial layered structure on a front surface of a transparent substrate wafer, the epitaxial layered structure defining a plurality of row cutting-line regions, a plurality of column cutting-line regions, and a plurality of light emitting units which are spaced apart from one another, each of the light emitting units having a projected area projected on the substrate wafer in a normal direction relative to the substrate wafer; forming a photoresist layer over a back surface of the substrate wafer, wherein the photoresist layer is formed with a plurality of windows that are aligned respectively with the alignment marks so as to permit visualization of the alignment marks therethrough from the back surface of the substrate wafer for alignment of the substrate wafer in subsequent photolithographic processing; aligning the substrate wafer in an exposure apparatus through the alignment marks from the back surface of the substrate wafer and patterning the photoresist layer so as to form a plurality of spaced apart openings in the photoresist layer using photolithographic techniques, the openings being respectively aligned with the light emitting units, each of the openings having an area less than the projected area of the respective one of the light emitting units; forming a solder layer on the photoresist layer such that the solder layer fills the openings in the photoresist layer; removing the photoresist layer and a portion of the solder layer, that covers the photoresist layer, from the substrate wafer so as to form a plurality of die-bonding members over the back surface of the substrate wafer; and dicing the substrate wafer from the back surface along the column cutting-line regions and the row cutting-line regions so as to form the light emitting diode dies.

According to another aspect of this invention, there is provided a light emitting diode wafer that comprises: a substrate wafer having front and back surfaces; an epitaxial layered structure formed on the front surface of the substrate wafer and defining a plurality of light emitting units, each of the light emitting units having a projected area projected on the substrate wafer in a normal direction relative to the substrate wafer; and a plurality of die-bonding members that are made of solder material, that are formed over the back surface of the substrate wafer and that are aligned respectively with the light emitting units. Each of the die-bonding members has a projected area projected on the substrate wafer in the normal direction relative to the substrate wafer. The projected area of each of the die-bonding members is less than the projected area of the respective one of the light emitting units so that when the light emitting diode wafer is diced into a plurality of light emitting diode dies and when the light emitting diode dies are to be bonded to a heated package substrate through reflow of the die-bonding members of the light emitting diode dies, overflow of each of the die-bonding members around side walls of the respective one of the light emitting diode dies can be prevented from occurring during the reflow of the die-bonding members on the package substrate.

According to yet another aspect of this invention, there is provided a light emitting diode die that comprises: a substrate having front and back surfaces; a light emitting unit formed on the front surface of the substrate and having a projected area projected on the substrate in a normal direction relative to the substrate; and a die-bonding member that is made of solder material, that is formed over the back surface of the substrate and that is aligned with the light emitting unit. The die-bonding member has a projected area projected on the substrate in the normal direction relative to the substrate. The projected area of the die-bonding member is less than the projected area of the light emitting unit so that when the light emitting diode die is to be bonded to a heated package substrate through reflow of the die-bonding member of the light emitting diode die, overflow of the die-bonding member around side walls of the light emitting diode die can be prevented from occurring during the reflow of the die-bonding member on the package substrate.

BRIEF DESCRIPTION OF THE DRAWINGS

In drawings which illustrate embodiments of the invention.

DETAILED DESCRIPTION OF THE PREFERRED EMBODIMENTS

Figure 1:
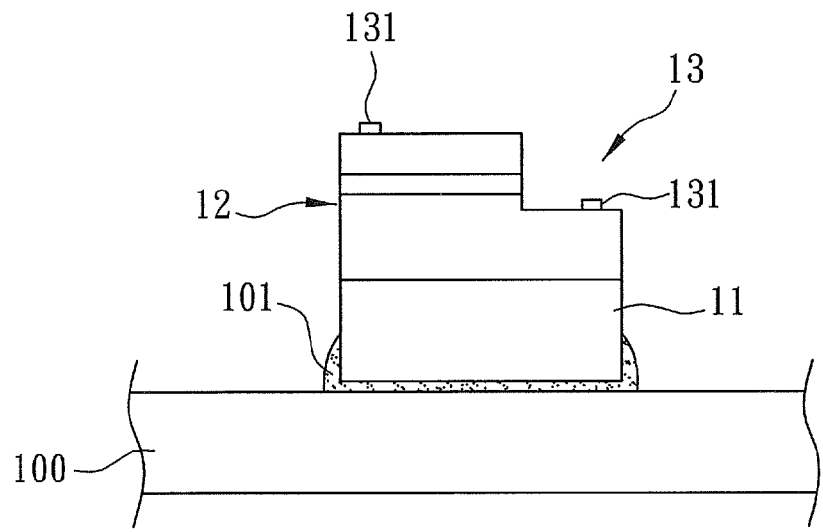
FIG. 1 is a fragmentary schematic view illustrating how a conventional light emitting diode die is attached to a package substrate through a silver paste.
Figure 2:
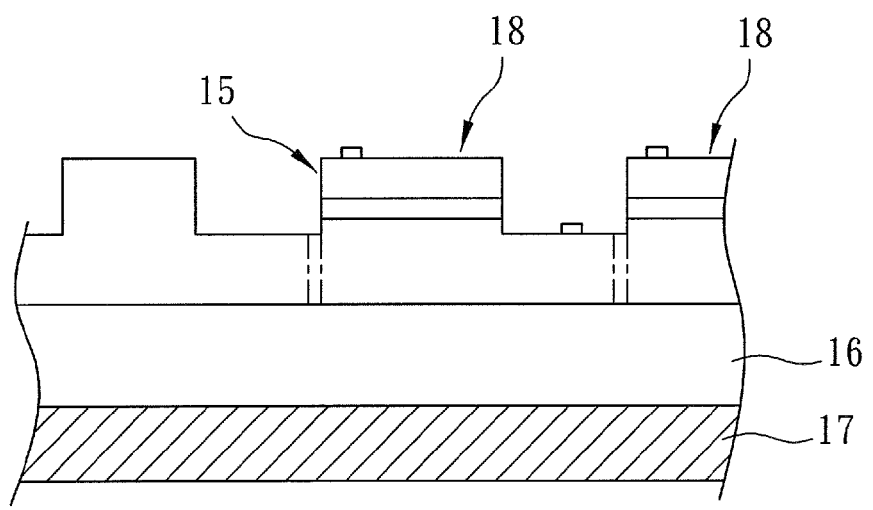
FIG. 2 is a fragmentary schematic view illustrating the configuration of a solder layer formed on a substrate wafer according to a conventional method of forming light emitting diode dies.
Figure 3:
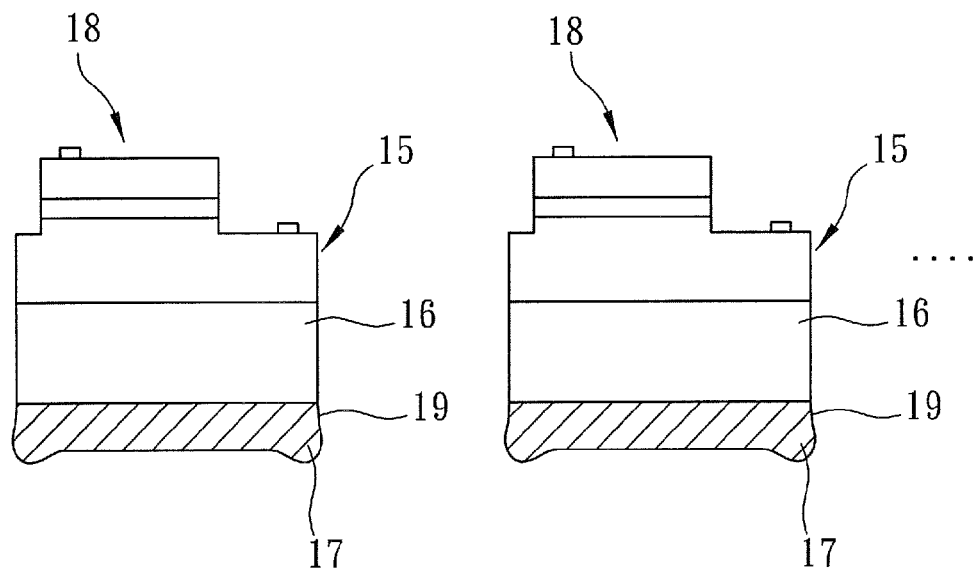
FIG. 3 is a schematic view illustrating the configuration of the light emitting diode dies formed by dicing the substrate wafer according to the conventional method.
Figure 4:
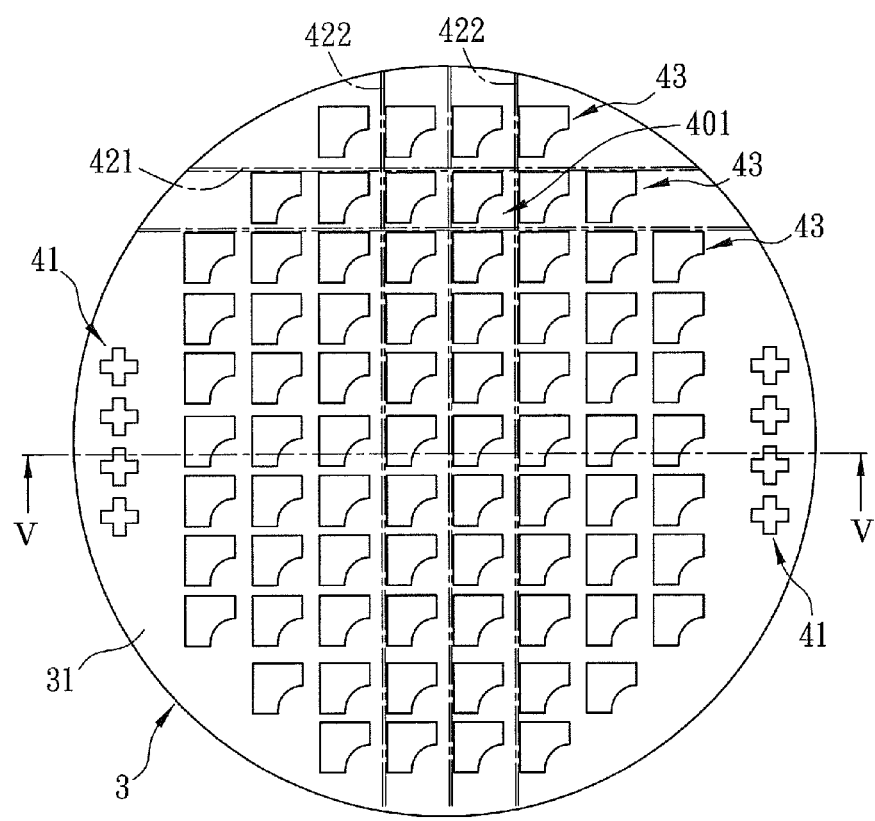
FIGS. 4 to 10 are schematic views illustrating consecutive steps of the first preferred embodiment of a method of forming light emitting diode dies according to the present invention.
Figure 5:
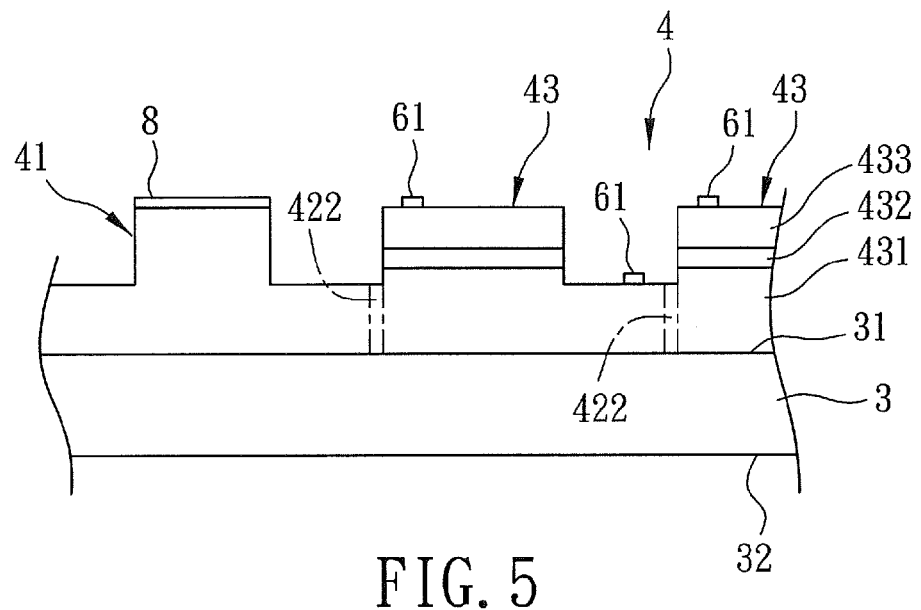
Figure 6:
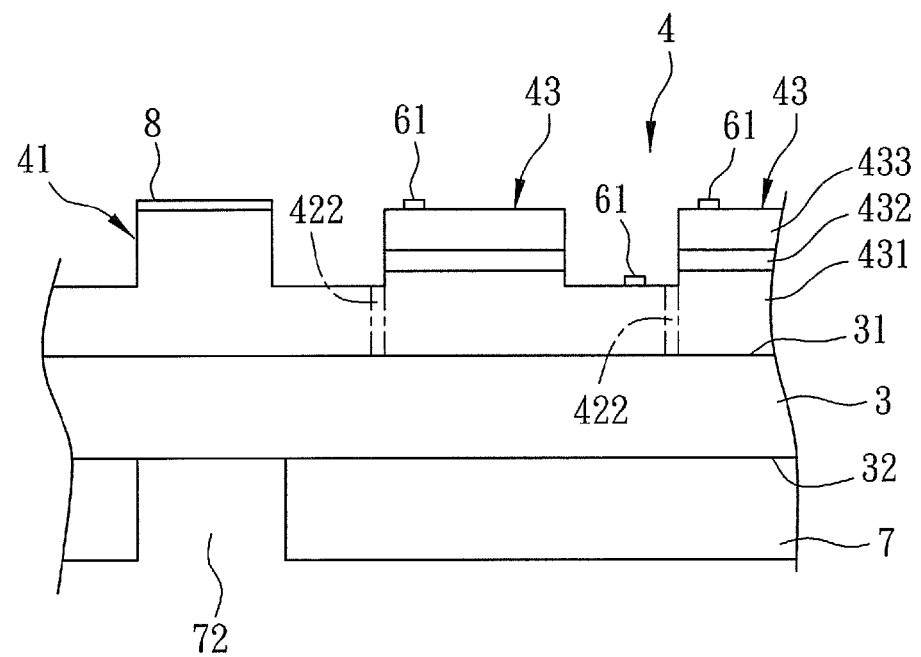
Figure 7:
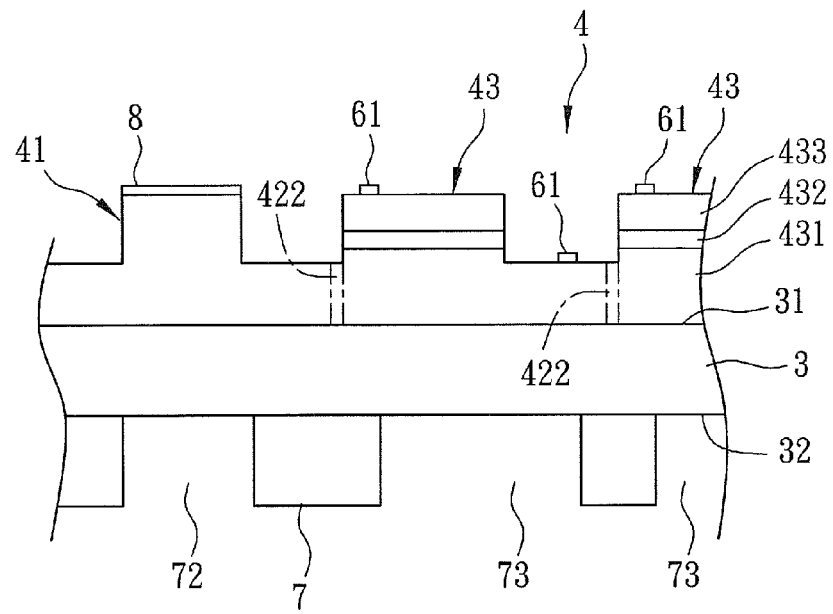
Figure 8:
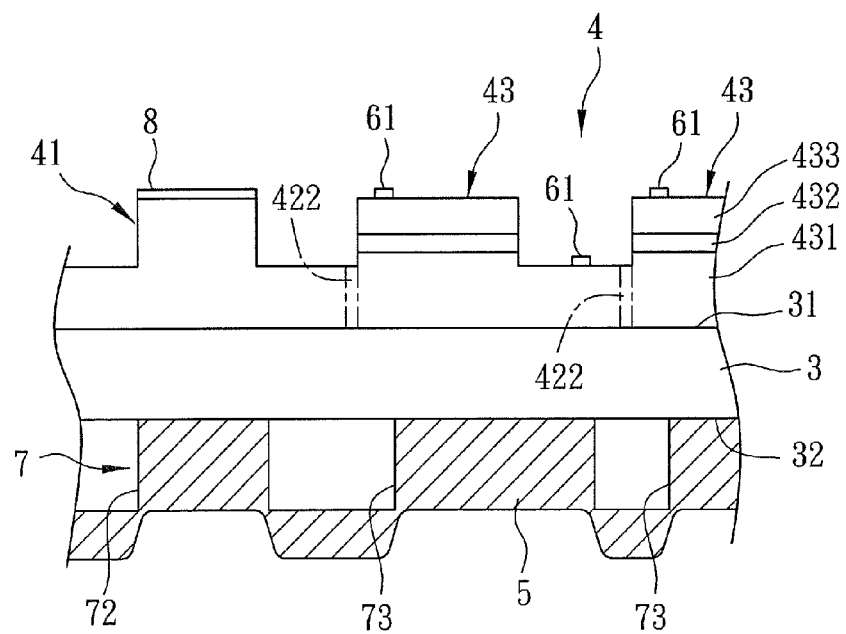
Figure 9:
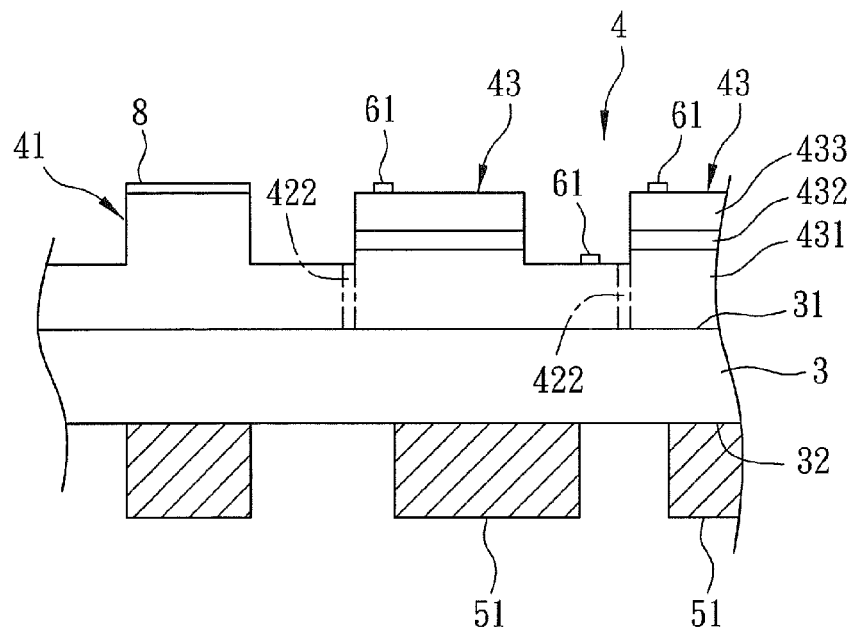
Figure 10:
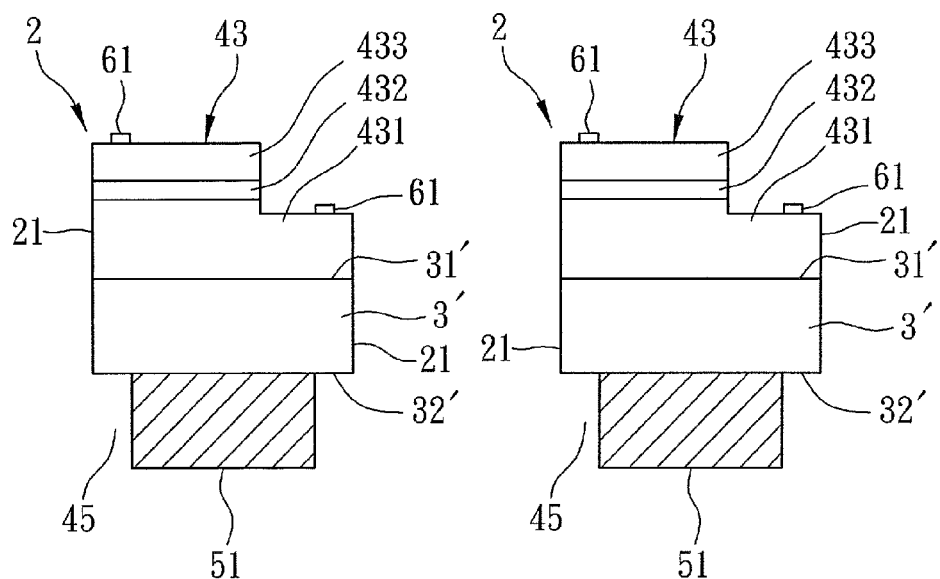

Before the present invention is described in greater detail with reference to the accompanying preferred embodiments, it should be noted herein that like elements are denoted by the same reference numerals throughout the disclosure.

FIGS. 4 to 10 illustrate consecutive steps of the first preferred embodiment of a method of forming a plurality of light emitting diode dies 2 according to the present invention. The method includes: forming a plurality of alignment marks 41 on a front surface 31 of a transparent substrate wafer 3 (see FIGS. 4 and 5); forming an epitaxial layered structure 4 on the front surface 31 of the transparent substrate wafer 3 (see FIGS. 4 and 5), the epitaxial layered structure 4 defining a plurality of row cutting-line regions 421, a plurality of column cutting-line regions 422, and a plurality of light emitting units 43 which are spaced apart from one another by the row cutting-line regions 421 and the column cutting-line regions 422, the column cutting-line regions 422 intersecting and cooperating with the row cutting-line regions 421 to define a plurality of die cells 401, each of which confines a respective one of the light emitting units 43, each of the light emitting units 43 having a projected area projected on the substrate wafer 3 in a normal direction relative to the substrate wafer 3; forming a pair of electrode pads 61 on each of the light emitting units 43 (see FIG. 5); forming a reflective layer 8 on the alignment marks 41 (see FIG. 5); forming a photoresist layer 7 over a back surface 32 of the substrate wafer 3, the photoresist layer 7 being formed with a plurality of windows 72 that are aligned respectively with the alignment marks 41 (see FIG. 6) so as to permit visualization of the alignment marks 41 therethrough from the back surface 32 of the substrate wafer 3 for alignment of the substrate wafer 3 in subsequent photolithographic processing; aligning the substrate wafer 3 in an exposure apparatus (not shown) through the alignment marks 41 from the back surface 32 of the substrate wafer 3 (for example, the alignment marks 41 are detected by a detecting light passing through the back surface 32 toward the alignment marks 41) and patterning the photoresist layer 7 so as to form a plurality of spaced apart openings 73 in the photoresist layer 7 using photolithographic techniques (see FIG. 7), the openings 73 being respectively aligned with the light emitting units 43, each of the openings 73 having an area less than the projected area of the respective one of the light emitting units 43; forming a solder layer 5 on the photoresist layer 7 such that the solder layer 5 fills the openings 73 in the photoresist layer 7 (see FIG. 8); removing the photoresist layer 7 and a portion of the solder layer 5, that covers the photoresist layer 7, from the substrate wafer 3 so as to form the solder layer 5 into a plurality of die-bonding members 51 over the back surface 32 of the substrate wafer 3 (see FIG. 9); and dicing the substrate wafer 3 from the back surface 32 along the column cutting-line regions 421 and the row cutting-line regions 422 so as to form the light emitting diode dies 2 (see FIG. 10).

Preferably, the ratio of the area of each of the openings 73 to the projected area of the respective one of the light emitting units 43 ranges from 0.5 to 0.9.

Each of the light emitting diode dies 2 (see FIG. 10) thus formed includes: a die substrate 3' having front and back surfaces 31', 32'; the light emitting unit 43 formed on the front surface 31' of the die substrate 3' and having a projected area projected on the die substrate 3' in a normal direction relative to the die substrate 3'; and the die-bonding member 51 formed over the back surface 32' of the die substrate 3' and aligned with the light emitting unit 43. The die-bonding member 51 has a projected area projected on the die substrate 3' in the normal direction relative to the die substrate 3'. The projected area of the die-bonding member 51 is less than the projected area of the light emitting unit 43 so that a peripheral end face of the die-bonding member 51 and the bottom surface 32' of the die substrate 3' cooperatively define a loop-shaped accommodating recess 45 therebetween and so that when the light emitting diode die 2 is to be bonded to a heated package substrate (not shown) through reflow of the die-bonding member 51 of the light emitting diode die 2, the loop-shaped accommodating recess 45 can accommodate an overflow of a melt of the die-bonding member 51 and so that overflow of the melt of the die-bonding member 51 around side walls 21 of the light emitting diode die 2 can be prevented from occurring during the reflow of the die-bonding member 51 on the package substrate. Preferably, the ratio of the projected area of the die-bonding member 51 to the projected area of the light emitting unit 43 ranges from 0.5 to 0.9. When the ratio of the projected area of the die-bonding member 51 to the projected area of the light emitting unit 43 is less than 0.5, the bonding strength between the die-bonding member 51 and the package substrate is insufficient, and when the ratio of the projected area of the die-bonding member 51 to the projected area of the light emitting unit 43 is greater than 0.9, overflow of the melt of the die-bonding member 51 around the side walls 21 of the light emitting diode die 2 may occur during reflow of the die-bonding member 51 on the package substrate.

Preferably, the reflective layer 8 is made from a reflective material selected from one of silver, chrome, nickel, aluminum, and a Distributed Bragg reflector (DBR).

Preferably, the solder layer 5 is made from an eutectic metal alloy or a metal paste, and more preferably, the solder layer 5 is made from a conductive material selected from one of silver paste, Au, Sn, Au—Sn alloy and Pb—Sn alloy.

Each of the light emitting units 43 includes a first conductivity-type cladding layer 431, a light emitting layer 432 and a second conductivity-type cladding layer 433. In one embodiment, the first conductivity-type cladding layer 431 is made from a n-type semiconductor material, the second conductivity-type cladding layer 433 is made from a p-type semiconductor material, and the light emitting layer 432 is made from a semiconductor material selected from one of AlN, GaN, InN, AlGaN, AlInN, InGaN, and AlInGaN. Preferably, the substrate wafer 3 is made from a material selected from one of sapphire, SiC, Si, GaAs, and ZnO or a material having hexagonal crystalline lattice.

It is noted that the alignment marks 41 are not only used in the exposure apparatus for patterning the photoresist layer 7 using photolithographic techniques, but also used in the step for defining the row cutting-line regions 421, the column cutting-line regions 422, and the light emitting units 43 using photolithographic techniques.

Formation of the solder layer 5 is conducted by coating techniques, plating techniques, or thin film deposition techniques.

Removal of the photoresist layer 7 and the portion of the solder layer 5 that covers the photoresist layer 7 is conducted by lift-off techniques.

Figure 11:
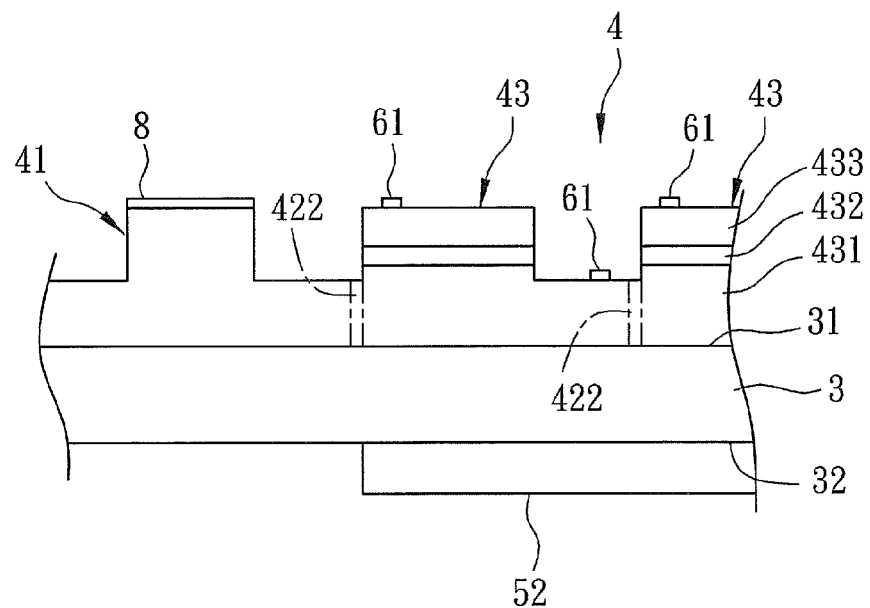
FIGS. 11 to 13 are schematic views illustrating consecutive steps of the second preferred embodiment of the method of forming light emitting diode dies according to the present invention.
Figure 12:
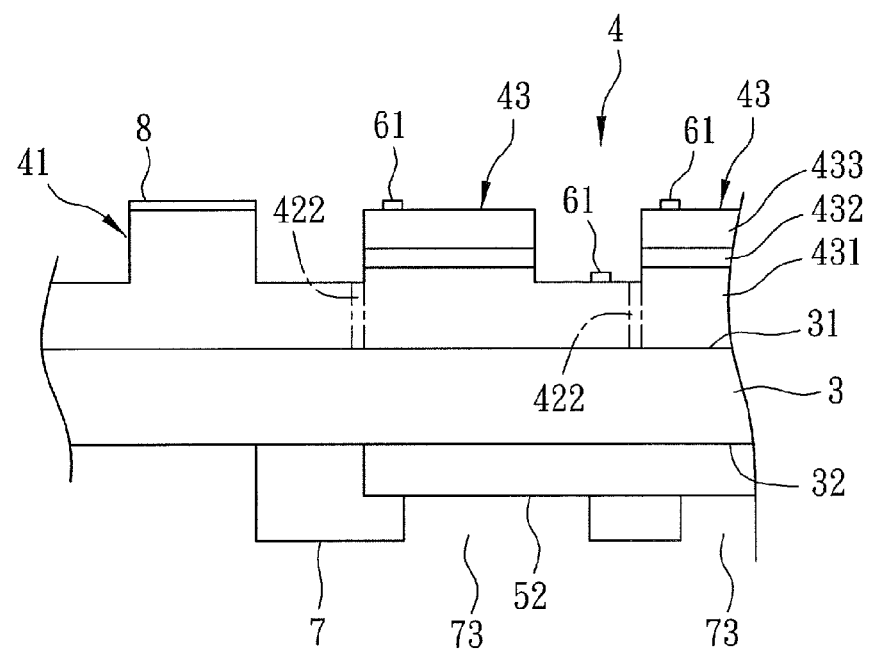
Figure 13:
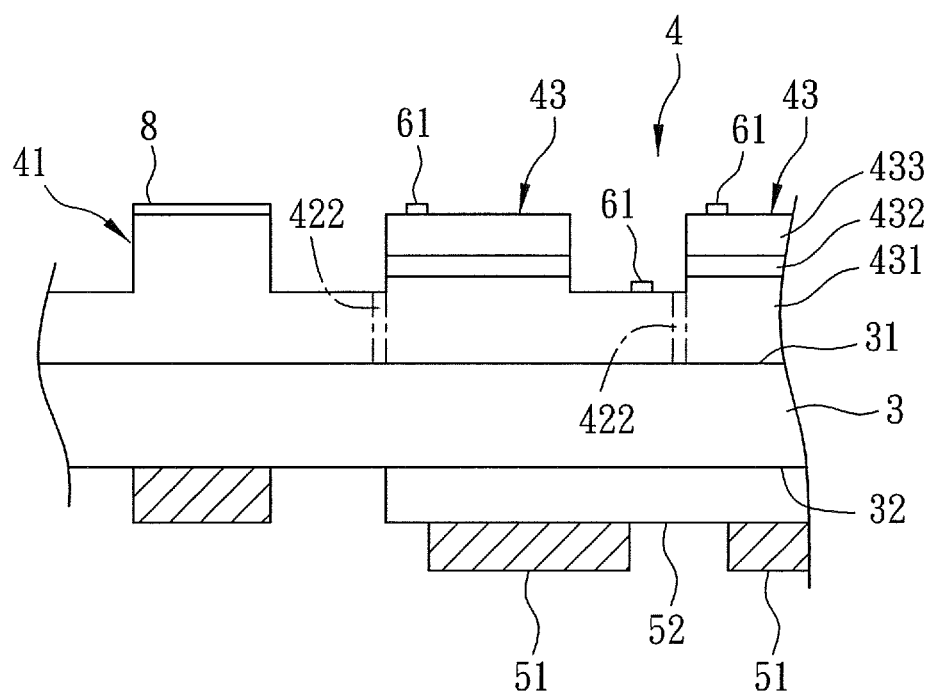

FIGS. 11 to 13 illustrate consecutive steps of the second preferred embodiment of the method of forming the light emitting diode dies 2 according to the present invention. The second preferred embodiment differs from the previous embodiment in that a thickness-enlarging layer 52 is formed on the back surface 32 of the substrate wafer 3 (see FIG. 11) prior to the formation of the photoresist layer 7. After formation of the thickness-enlarging layer 52, the photoresist layer 7 is formed and patterned on the thickness-enlarging layer 52 (see FIG. 12), followed by forming the die-bonding members 51 (see FIG. 13) and dicing the substrate wafer 3 so as to form the light emitting diode dies 2. Formation of the thickness-enlarging layer 52 is conducted by covering portions of the back surface 32 of the substrate wafer 3, that are respectively aligned with the alignment marks 41, using a shadow mask (not shown), followed by coating the thickness-enlarging layer 52 on the remainder of the back surface 32 of the substrate wafer 3 that is not covered by the shadow mask and then removing the shadow mask from the substrate wafer 3 after formation of the thickness-enlarging layer 52.

Preferably, the thickness-enlarging layer 52 is made from the eutectic metal alloy or the metal paste.

The thickness of the die-bonding members 51 may vary according to the actual requirements for different packaging products. Since the photoresist layer 7 is relatively thin, the openings 73 formed in the photoresist layer 7 can only have a shallow depth. As such, the die-bonding members 51 thus formed in the first preferred embodiment can only have a relatively thin thickness, and may not be suited for some applications that require a thick thickness. Hence, formation of the thickness-enlarging layer 52 in the second preferred embodiment can overcome the drawback encountered in the previous embodiment.

By forming the photoresist layer 7 over the back surface 32 of the substrate wafer 3 and aligning the substrate wafer 3 in the exposure apparatus through the alignment marks 41 from the back surface 32 of the substrate wafer 3, followed by patterning the photoresist layer 7 for subsequent formation of the die-bonding members 51 in the method of this invention, the aforesaid drawbacks associated with the prior art can be eliminated.

While the present invention has been described in connection with what are considered the most practical and preferred embodiments, it is understood that this invention is not limited to the disclosed embodiments but is intended to cover various arrangements included within the spirit and scope of the broadest interpretation and equivalent arrangements.

What is claimed is:

1. A method of forming light emitting diode dies, comprising:

forming a plurality of alignment marks and an epitaxial layered structure on a front surface of a transparent substrate wafer, the epitaxial layered structure defining a plurality of row cutting-line regions, a plurality of column cutting-line regions, and a plurality of light emitting units which are spaced apart from one another, each of the light emitting units having a projected area projected on the substrate wafer in a normal direction relative to the substrate wafer;

forming a photoresist layer over a back surface of the substrate wafer, wherein the photoresist layer is formed with a plurality of windows that are aligned respectively with the alignment marks so as to permit visualization of the alignment marks therethrough from the back surface of the substrate wafer for alignment of the substrate wafer in subsequent photolithographic processing;

aligning the substrate wafer in an exposure apparatus through the alignment marks from the back surface of the substrate wafer and patterning the photoresist layer so as to form a plurality of spaced apart openings in the photoresist layer using photolithographic techniques, the openings being respectively aligned with the light emitting units, each of the openings having an area less than the projected area of the respective one of the light emitting units;

forming a solder layer on the photoresist layer such that the solder layer fills the openings in the photoresist layer;

removing the photoresist layer and a portion of the solder layer, that covers the photoresist layer, from the substrate wafer so as to form a plurality of die-bonding members over the back surface of the substrate wafer; and dicing the substrate wafer from the back surface along the column cutting-line regions and the row cutting-line regions so as to form the light emitting diode dies.

2. The method of claim 1, wherein the ratio of the area of each of the openings to the projected area of the respective one of the light emitting units ranges from 0.5 to 0.9.

3. The method of claim 1, further comprising forming a reflective layer on the alignment marks.

4. The method of claim 3, wherein the reflective layer is made from a reflective material selected from the group consisting of silver, chrome, nickel, aluminum, and a Distributed Bragg reflector.

5. The method of claim 1, wherein the solder layer is made from an eutectic metal alloy or a metal paste.

6. The method of claim 1, wherein the solder layer is made from a conductive material selected from the group consisting of silver paste, Au, Sn, Au—Sn alloy and Pb—Sn alloy.

7. The method of claim 1, further comprising forming a thickness-enlarging layer on the back surface of the substrate wafer prior to the formation of the photoresist layer, followed by forming the photoresist layer on the thickness-enlarging layer.

8. The method of claim 7, wherein formation of the thickness-enlarging layer is conducted by covering portions of the back surface of the substrate wafer, that are respectively aligned with the alignment marks, using a shadow mask, followed by forming the thickness-enlarging layer on the remainder of the back surface of the substrate wafer that is not covered by the shadow mask and removing the shadow mask from the substrate wafer after formation of the thickness-enlarging layer.

9. The method of claim 7, wherein the thickness-enlarging layer is made from an eutectic metal alloy or a metal paste.

\* \* \* \* \*